US006881073B2

(12) United States Patent
Bali et al.

(10) Patent No.: US 6,881,073 B2
(45) Date of Patent: Apr. 19, 2005

(54) ELECTRICAL CONNECTOR

(75) Inventors: Anil Bali, Glen Ellyn, IL (US);
Edmund S. Kirkus, Lemont, IL (US);
David Philippi, Oak Park, IL (US);
Arun Shah, Bartlett, IL (US)

(73) Assignee: Cinch Connectors, Inc., Lombard, IL (US)

( * ) Notice: Subject to any disclaimer, the term of this patent is extended or adjusted under 35 U.S.C. 154(b) by 32 days.

(21) Appl. No.: 10/639,351

(22) Filed: Aug. 12, 2003

(65) Prior Publication Data

US 2005/0037639 A1 Feb. 17, 2005

(51) Int. Cl.[7] .............................................. H01R 12/00
(52) U.S. Cl. .......................... 439/70; 439/71; 439/594; 439/717
(58) Field of Search .............................. 439/70, 71, 66, 439/717, 594, 68

(56) References Cited

U.S. PATENT DOCUMENTS

| 3,042,895 | A | | 7/1962 | Bonhomme |
| 4,552,422 | A | * | 11/1985 | Bennett et al. ............... 439/70 |
| 4,703,984 | A | * | 11/1987 | Mitchell, Jr. .................. 439/70 |
| 5,155,905 | A | | 10/1992 | Miller, Jr. |
| 5,443,404 | A | | 8/1995 | Matsuoka |
| 5,648,890 | A | * | 7/1997 | Loo et al. .................... 361/704 |
| 5,648,893 | A | * | 7/1997 | Loo et al. .................... 361/820 |
| 5,702,255 | A | | 12/1997 | Murphy et al. |
| 6,064,576 | A | | 5/2000 | Edwards et al. |
| 6,198,630 | B1 | | 3/2001 | Cromwell |
| 6,293,810 | B1 | * | 9/2001 | Goodwin et al. ............. 439/71 |
| 6,358,063 | B1 | | 3/2002 | Neldich |
| 6,366,467 | B1 | | 4/2002 | Patel et al. |
| 6,439,894 | B1 | | 8/2002 | Li |
| 6,449,155 | B1 | | 9/2002 | Colbert et al. |
| 6,679,707 | B1 | | 1/2004 | Brodsky et al. |
| 6,707,684 | B1 | * | 3/2004 | Andric et al. ................ 361/785 |
| 2003/0000080 | A1 | | 1/2003 | Colbert et al. |

OTHER PUBLICATIONS

Photographs of an electrical connector (5184 interposer) by Cinch Connectors, approximately Sep. 1999.

* cited by examiner

*Primary Examiner*—Tho D. Ta
(74) *Attorney, Agent, or Firm*—Leydig, Voit & Mayer, Ltd.

(57) ABSTRACT

Disclosed is an interposer assembly that can be located between an integrated circuit package and a circuit carrying element for establishing communication there between. The interposer assembly includes a frame defining a window that holds together a plurality of panels having apertures for accommodating electrical contacts. Each panel includes an interlocking edge for engaging an opposing interlocking edge of an adjacent panel and a frame edge for engaging the frame. The apertures can be arranged across the panels to extend from the frame edge to a location near the interlocking edges. In various embodiments, the interlocking edges can be formed as a tongue and groove design or as a pair of interlocking claws. In an embodiment, the frame edge can include a flange that is set within a step formed on the frame. The panel and frame may be permanently joined by heat staking.

67 Claims, 18 Drawing Sheets

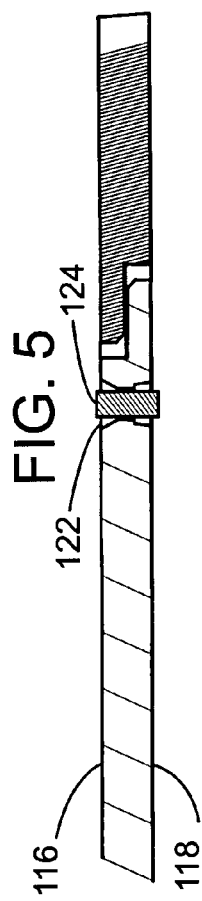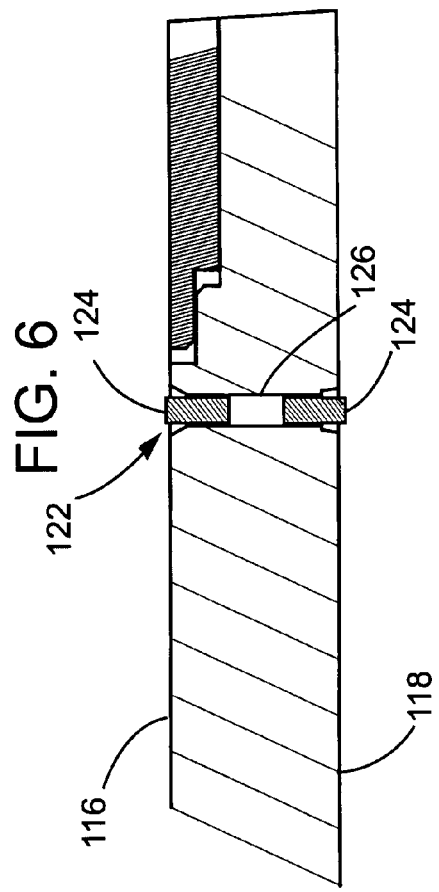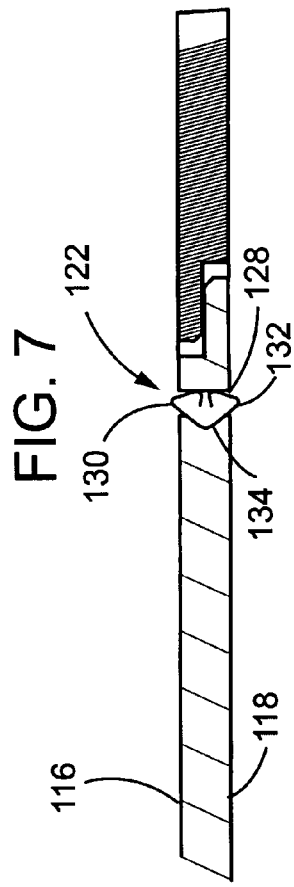

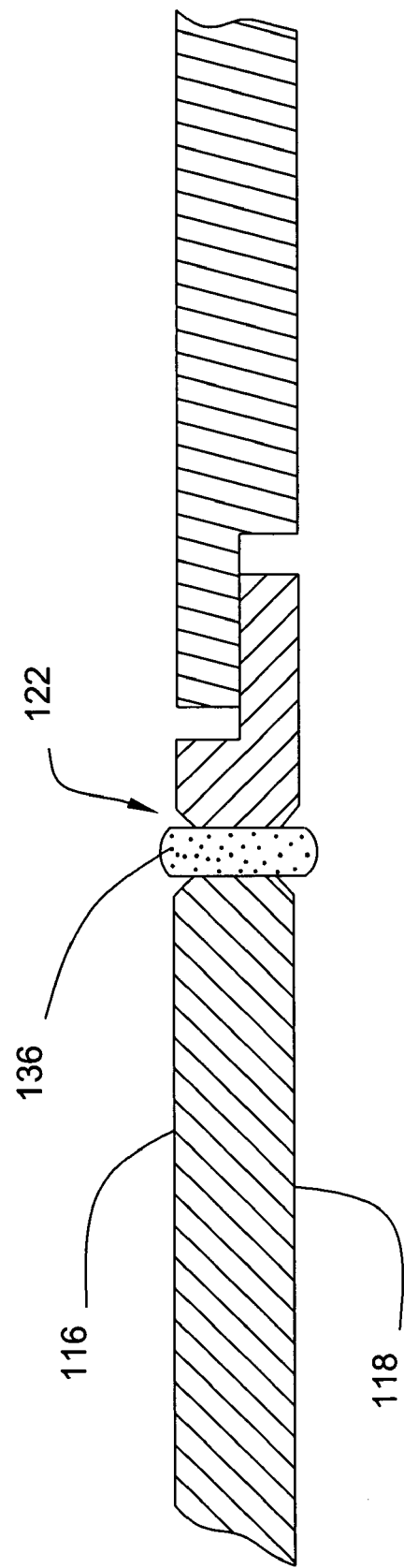

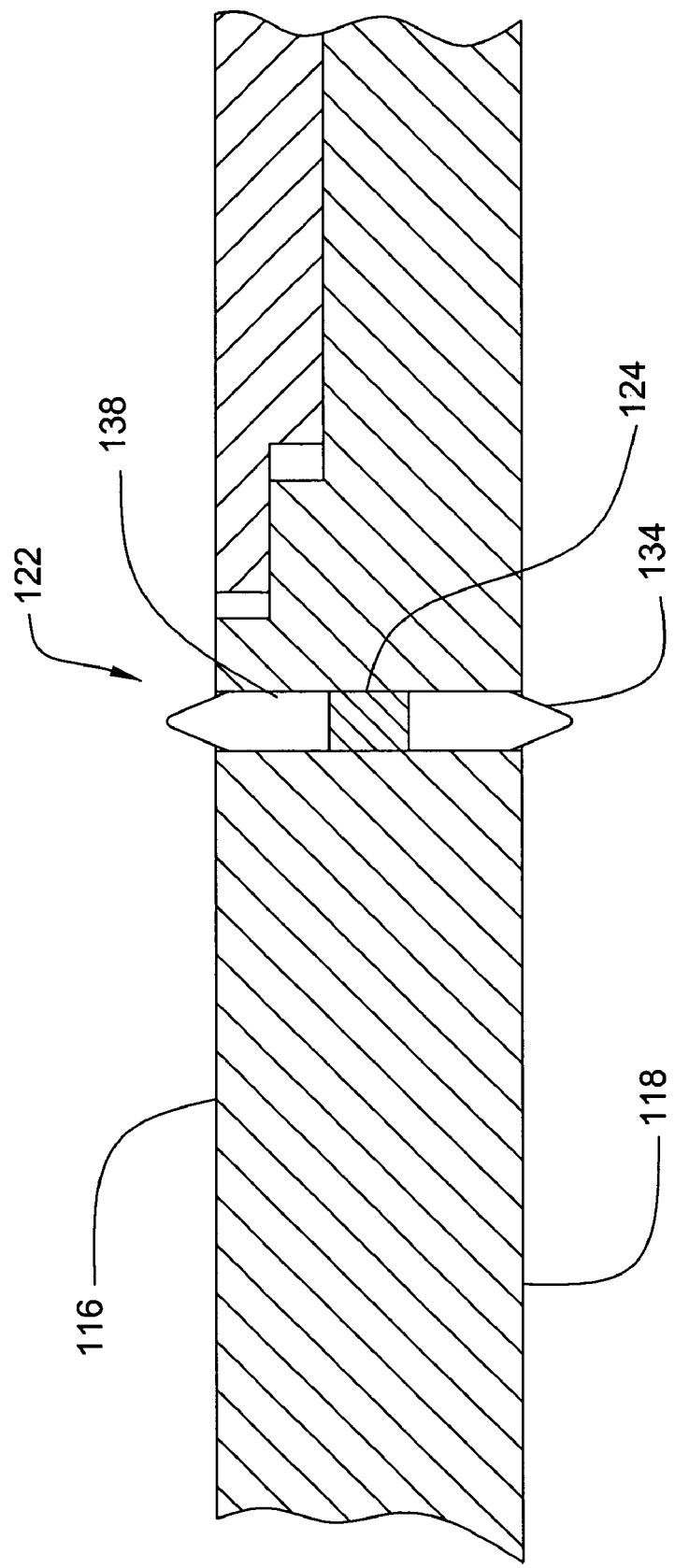

ELECTRICAL CONNECTOR

FIELD OF THE INVENTION

The present invention relates generally to electronic communications devices and, more particularly, to an electrical connector that can house a plurality of electrical contacts. The present invention finds particular use in establishing electrical communication between an integrated circuit and a circuit-carrying element.

BACKGROUND OF THE INVENTION

To incorporate an integrated circuit package into an electronic system, the integrated circuit is typically connected to a printed circuit board or similar element through which the integrated circuit package can communicate with other components of the system. The integrated circuit package can include one or more electrically conductive contact pads while the printed circuit board can include conductive traces. Often, the contact pads and conductive traces are arranged in corresponding patterns referred to as Land Grid Arrays ("LGA's"). Electrical communication between the contact pads and the conductive traces is typically achieved by placing an electrical connector between the integrated circuit package and the printed circuit board.

Interposer assemblies, as will be familiar to those of skill in the art, typically include an insulative housing or similar structure that can accommodate a plurality of electrically conductive contacts. The contacts are commonly held in holes disposed through the housing. To maximize the number of contacts that can be accommodated, the holes are often densely packed together. Furthermore, the interposer assembly desirably should accommodate the conductive contacts so that the contacts are aligned with the LGA's on the integrated circuit package and the printed circuit board, an attribute that requires precise alignment of the holes within the housing.

To reduce the cost of the interposer assembly, the housing is preferably made from molded plastic. Of course, to fabricate the housing with the precise alignment required, precision molding machines are needed. Such machines have thus far been capable of producing interposer assemblies of moderate sizes.

Because of the advances in integrated circuit technology, the number of communication paths that must be established between the integrated circuit package and the rest of the system, and thus accordingly the number of electrical contacts required in the interposer assembly has increased dramatically. To accommodate more contacts in the already densely packed interposer assembly, the overall dimensions of the interposer assembly have gradually increased. Increasing the size of the interposer assembly, however, generates a problem with injection molding the housing.

More specifically, with molded plastics a phenomenon known as shrinkage occurs whereby the plastic contracts upon itself as it cools after molding thereby distorting the finished part. The effects of shrinkage are minimal when only a small volume of plastic is molded to make a part. Increasing the amount of plastic though, as is necessary to increase the size of the housing for the larger interposer assemblies, exacerbates the shrinkage problem and sacrifices the precision needed to densely pack and align the contacts.

SUMMARY OF THE INVENTION

The present invention provides an interposer assembly and method of making the same that can incorporate increased dimensions without a significant sacrifice in the overall precision of the interposer. The interposer assembly includes a frame that defines a window and a panel or plurality of panels through which are disposed apertures for accommodating the contacts. In one embodiment, each panel includes a frame edge for engaging the frame and an interlocking edge for engaging the interlocking edge of an adjacent frame. The panels are placed adjacent to each other and held together within the frame by engaging the frame edges with the sides of the frame and the interlocking edges with the interlocking edges of adjacent panels. The engagement between the frame edges of the panels and the sides of the frame incorporates enough play so that some inexactitude can be tolerated in the production of the frame. To avoid obstructing contact between the electrical contacts and the contact pads, the frame and panels are preferably formed to produce a generally planer interposer assembly that allows the contact to protrude beyond the first and second surfaces of the interposer assembly. In another embodiment, a single thin, planer panel with one or more frame edges can be provided which engages the frame.

An advantage of the single or multiple panel interposer assembly is that only a small amount of plastic is required to mold each panel thereby reducing shrinkage problems. A related advantage is that a larger interposer assembly incorporating a larger number of contacts can be produced without sacrificing precision and/or alignment among the contact locations. An advantage of placing the panels adjacent to each other is that apertures can be disposed through the panel in close proximity to the interlocking edges, again increasing the number of contacts that can be accommodated within the interposer assembly. These and other advantages and features of the present invention will be apparent from the following detailed description and the accompanying drawings.

BRIEF DESCRIPTION OF THE DRAWINGS

FIG. 5 is a detailed view taken of the indicated area of FIG. 4 illustrating in cross-section an embodiment of a contact accommodated in an aperture.

FIG. 6 is a detailed view similar to FIG. 5 illustrating in cross-section another embodiment of a contact accommodated in an aperture.

FIG. 7 is a detailed view similar to FIG. 5 illustrating in cross-section another embodiment of a contact accommodated in an aperture.

FIG. 7a is a detailed view similar to FIG. 5 illustrating in cross-section another embodiment of a contact accommodated in an aperture.

FIG. 7b is a detailed view similar to FIG. 5 illustrating in cross-section another embodiment of a contact accommodated in an aperture.

DETAILED DESCRIPTION OF THE EMBODIMENTS

Figure 1:
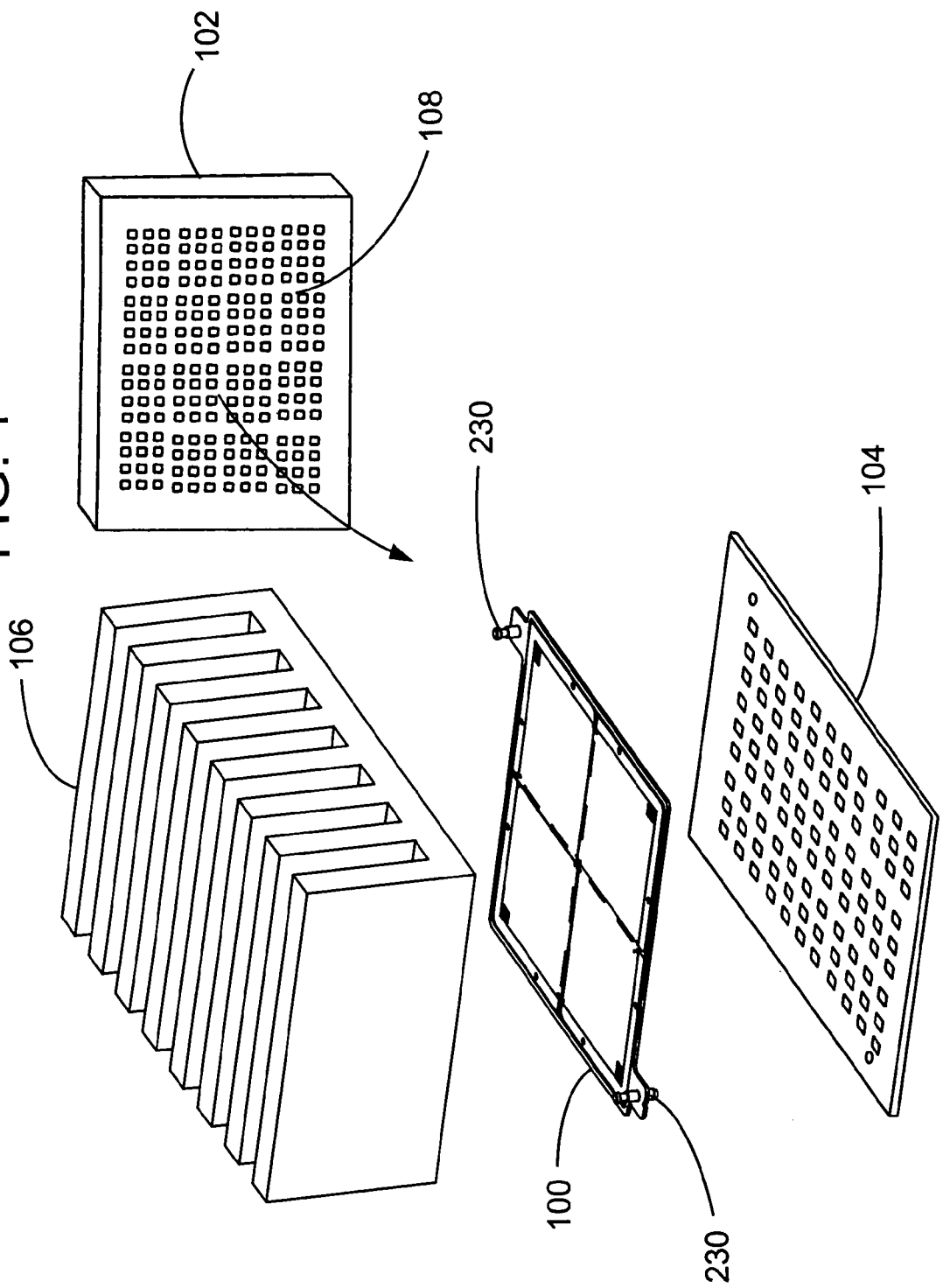
FIG. 1 is an exploded, perspective view of an interposer assembly designed in accordance the teachings of the present invention in an illustrative setting placed between an integrated circuit package and a circuit-carrying element.

Now referring to the drawings, wherein like reference numerals refer to like features, there is illustrated in FIG. 1 an embodiment of an interposer assembly 100 situated in a typical application between an integrated circuit package 102 and a printed circuit board 104. In the particular application illustrated, to conduct heat away from the integrated circuit package 102, a heat sink 106 can be located above and attached to the upper surface of the integrated circuit package. To establish electrical communication with the integrated circuit package 102, there is located on the lower surface thereof a plurality of electrically conductive contact pads 108 arranged in a grid pattern and hereforth referred to as a land grid array ("LGA"). Located on the upper surface of the printed circuit board 104 is a corresponding LGA configuration of a plurality of electrical contact pads or traces 110. Electrical communication between the integrated circuit package 102 and the printed circuit board 104 is established through the planer interposer assembly 100 that accommodates a plurality of electrical contacts.

In accordance with the present invention, there is provided an interposer assembly that includes a plurality of panels arranged and held within a frame. Each panel has disposed through it a plurality of apertures that can accommodate an electrical contact through which electrical communication can be established. The panels are arranged so that a portion of the edges of each panel are in contact with an edge of an adjacent panel and another portion of the edges are in contact with the frame. To provide rigidity and stability among the panels of the interposer assembly, the edges that contact each other are configured or shaped with interlocking features.

Figure 2:
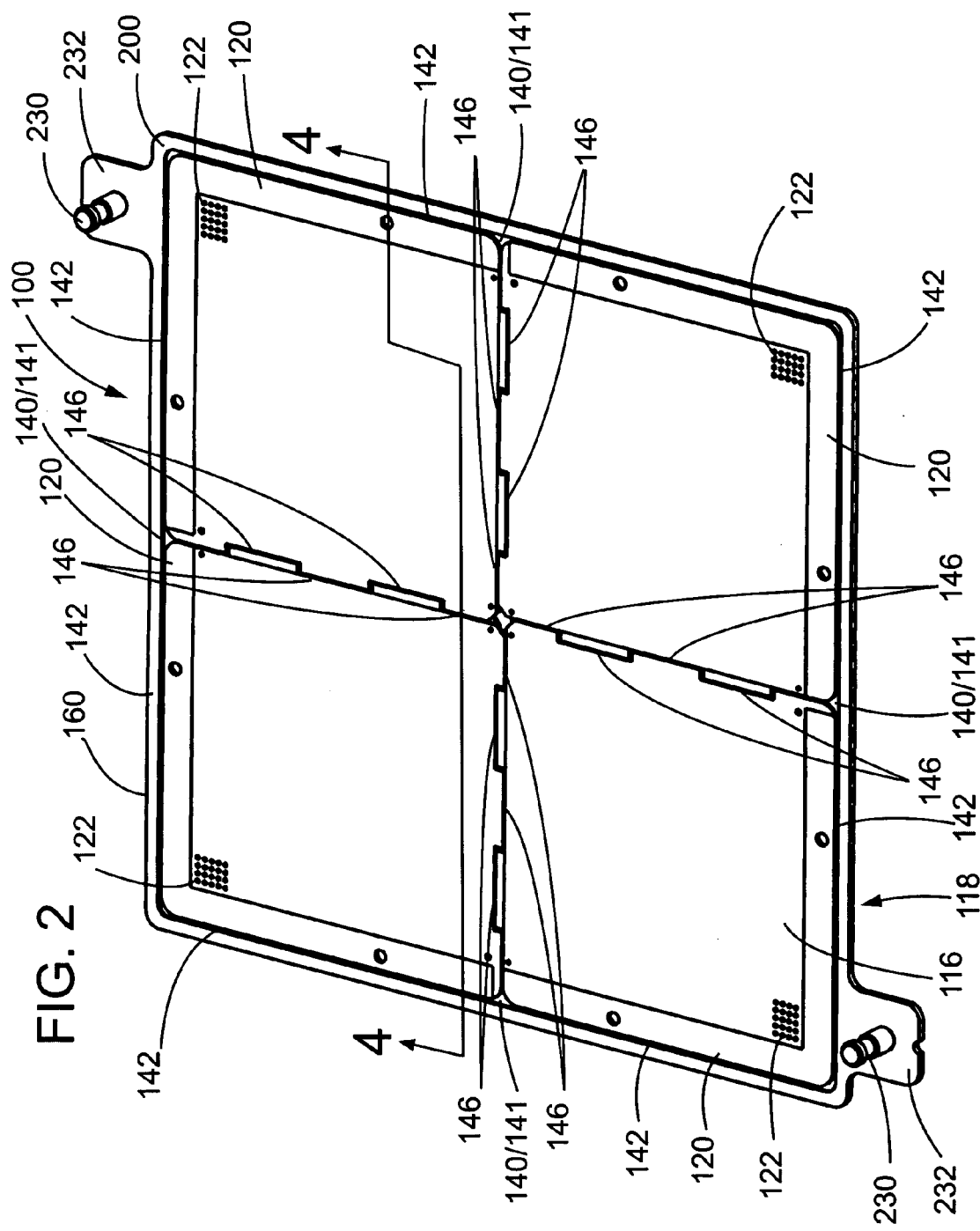
FIG. 2 is a perspective view of a first surface of the interposer assembly as assembled illustrating a plurality of interconnected panels engaging a frame.
Figure 3:
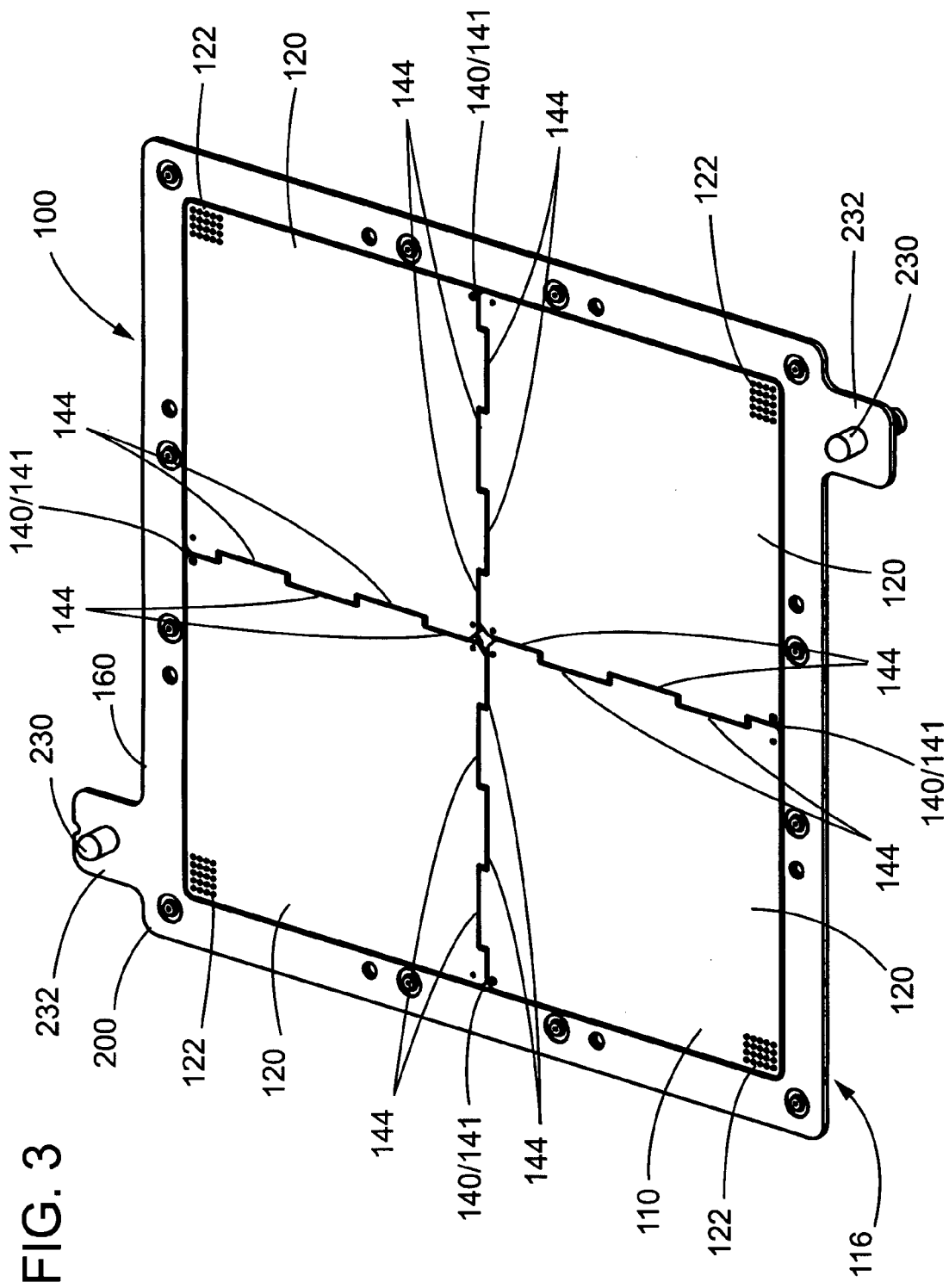
FIG. 3 is a perspective view of a second surface the interposer assembly opposite the first surface.
Figure 4:
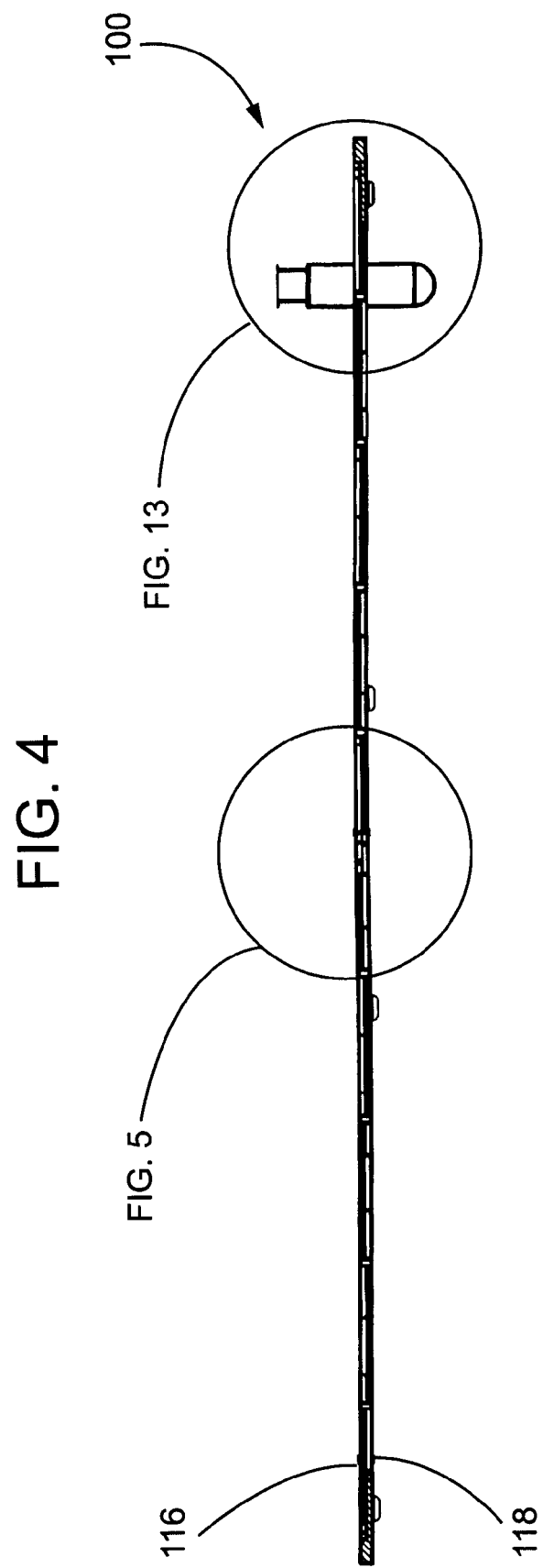
FIG. 4 is a side elevational view of the cross-section taken along line 4—4 of FIG. 2.

Referring to FIGS. 2 and 3, the illustrated embodiment of the interposer assembly 100 includes four panels 120 arranged in a 2×2 configuration adjacent to one another and assembled together within a frame 200 to form, as illustrated in FIG. 4, a generally flat plane that defines a first surface 116 and a second surface 118. Referring to FIGS. 2 and 3, to accommodate the electrical contacts, each panel 120 includes a plurality of apertures 122 disposed there through between the first and second surfaces. The apertures are preferably arranged in a pattern that corresponds to the LGA's located on the integrated circuit board and the printed circuit board.

In an embodiment, each panel can be molded from liquid crystal polymer ("LCP") by a precision molding process. The precision injection molding process is capable of molding all the features of panel, including the edges and the apertures. Preferably, in the illustrated embodiment, each panel is, approximately 2 inches long by 2 inches wide and 0.032 inches thick. The volume of LCP material used to form each panel is approximately 0.106 cubic inches.

Each aperture 122 in the embodiment illustrated in FIG. 5 is configured to accommodate at least one contact 124 such that the contact extends between and protrudes slightly beyond the first and second surfaces 116, 118. Because the contact 124 protrudes beyond the surfaces, it can contact the pads of the LGA and the contact surfaces on the printed circuit board. Preferably, to establish a reliable electrical connection, the contact is resilient so that it may be compressed between and urge back against the pads and the contact surfaces.

In the illustrated embodiment, the contact 124 is a cylindrically shaped, wadded wire contact that demonstrates substantial resiliency. Contacts of this type can be manufactured from randomly wadded single thin gauge electrically conductive wire. By way of example, the contacts can be of the type are marketed by Cinch Connectors Inc. of Lombard, Ill. under the designation CIN::ASPE. To retain the wadded wire contact 124 within the aperture 122, the aperture is preferably shaped as an hourglass with the flared ends proximate the first and second surfaces 116, 118. An advantage of the hourglass shape is that the recessed mid-portion pinches and holds the wadded wire contact while the flared ends provide the wadded wire contact with room for displacement when it is compressed.

Referring to FIG. 6, in another embodiment, each aperture 122 may accommodate two resilient wadded wire contacts 124 and a rigid slug contact 126. The slug contact 126 is made from an electrically conductive material and can have an elongated, cylindrical shape with two opposed ends. By way of example, slug contacts can be of the type marketed by Cinch Connectors Inc. of Lombard, Ill., under the designation Cinch part no. 462941550. The slug contact 126 is located completely within the aperture with its ends abutting against the resilient wadded wire contacts 124 that, in turn protrude beyond the first and second surfaces 116, 118.

Referring to FIG. 7, in another embodiment, each aperture 122 may accommodate a spring contact 128. In one embodiment, the spring contact 128 is made from an electrically conductive material and can have opposing upper most and lower most points 130, 132 joined by a common curved back 134. The spring contact 128 is located in the aperture 122 so that the upper and lower most points 130, 132 protrude beyond the first and second surfaces 116, 118. To provide resiliency to the spring contact 128, the curved back functions 134 as a cantilevered spring that allows the upper and lower most points 130, 132 to move with respect to each other.

Referring to FIG. 7a, in another embodiment, each aperture 122 may accommodate an elastomeric contact 136. The elastomeric contact 136 can be made from a mixture of elastic material and conductive particles. This provides the elastomeric contact 136 with both a resilient quality and the capability of conducting electricity. The elastomeric contact 136 is preferably retained within the aperture such that ends of the elastomeric contact protrude slightly beyond the first 116 and second 118 surfaces.

Referring to FIG. 7b, in another embodiment, each aperture 122 may accommodate a first and second rigid plunger 138, 139 in addition to a resilient wadded wire contact 124. The plungers have an elongated cylindrical shape with tapered ends and are made of a conductive material, such as metal. By way of example, suitable plungers are available from Cinch Connectors under the part number 4621415095. In the illustrated embodiment, the wadded wire contact 124 is located inside the aperture 122 with the plungers placed on either side. The wadded wire contact 124 urges against the plungers 138, 139 causing them to protrude from either the first 116 or second surface 118 of the panel. Because of the resilient nature of the wadded wire contact 124, the wadded wire contact can deflect when the plungers 138, 139 are pressed into the aperture by contact with the contact pads or traces.

Figure 8:
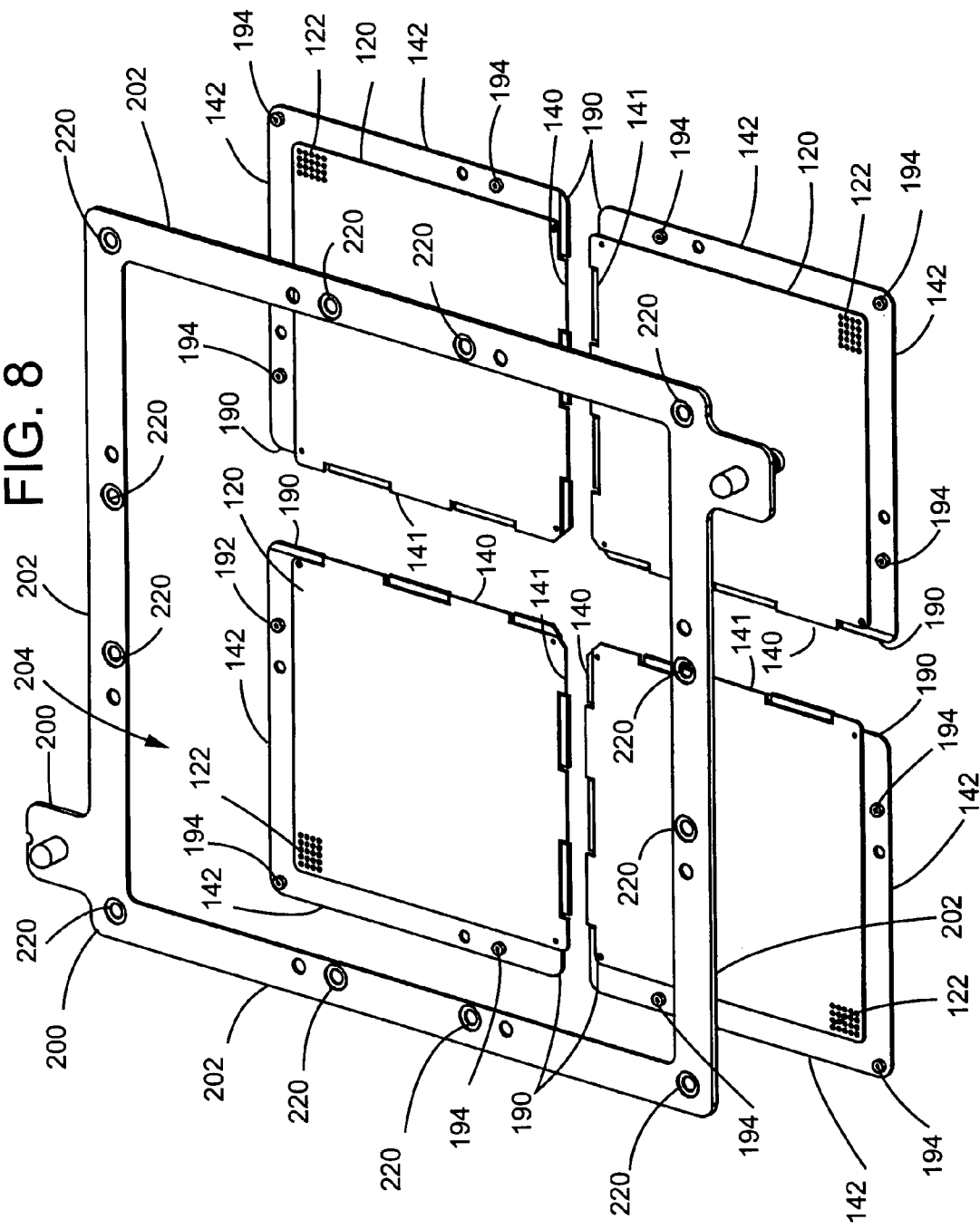
FIG. 8 is an exploded, perspective view of the interposer assembly as unassembled illustrating the panels and frame.

Illustrated in FIG. 8 are the plurality of panels 120 and the frame 200 prior to assembly. In addition to including the apertures 122, each panel 120 is planer and generally square in shape. To define the square, each panel 122 includes two interlocking edges 140, 141 that are perpendicular to each other and two frame edges 142 that are likewise perpendicular to each other. Because of the perpendicular arrangement of the edges, each interlocking edge 140, 141 is parallel to one of the frame edges 142. When assembled together, as illustrated in FIGS. 2 and 3, the interlocking edges 140, 141 of the adjacent panels 120 engage each other in an interlocking manner to provide rigidity and stability to the center of the interposer assembly 100 while the frame edges 142 engage the frame 200 in a supporting manner to hold the interposer assembly together.

Figure 9:
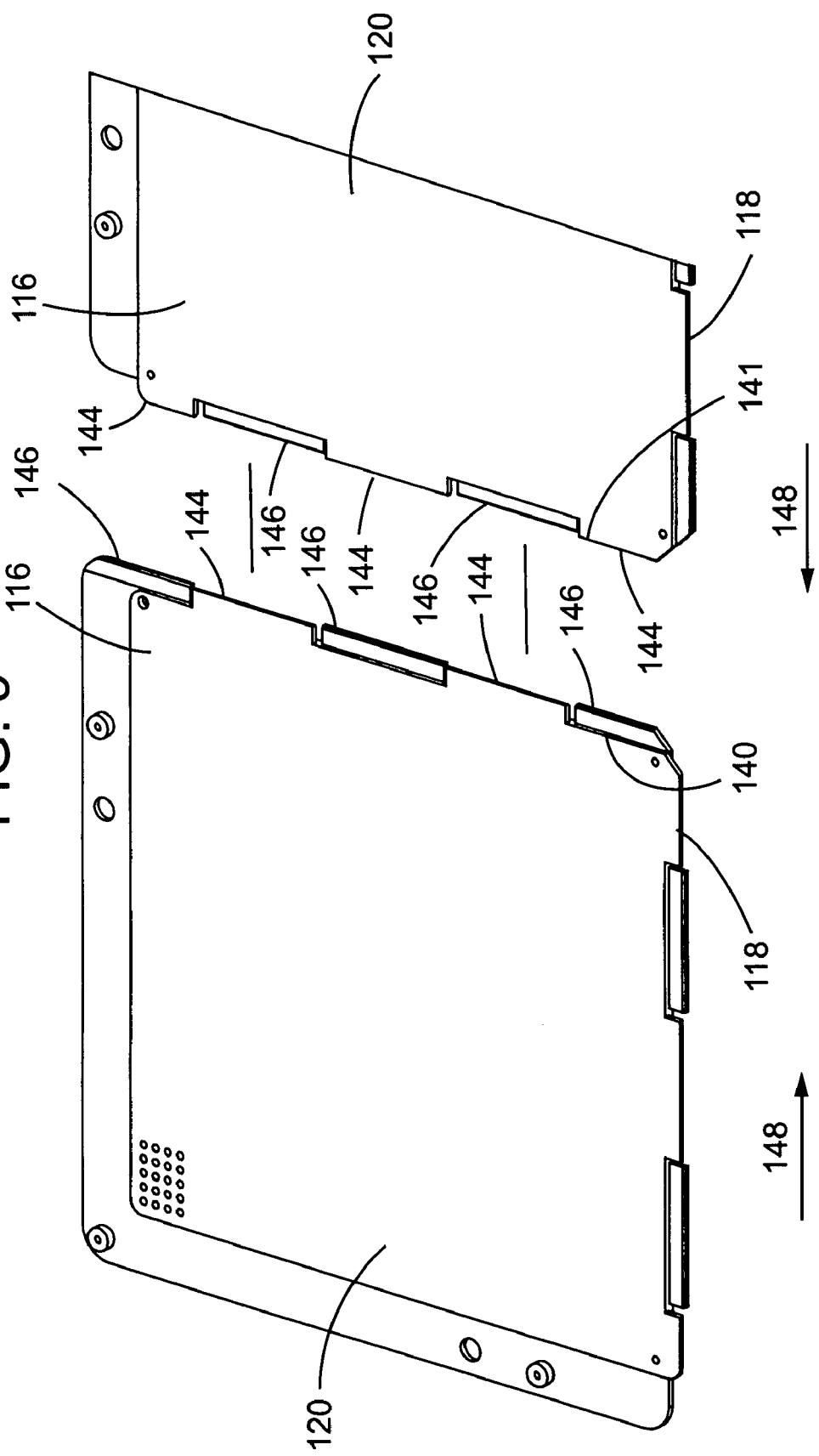
FIG. 9 is a perspective view of two panels illustrating an interlocking edge and an opposing interlocking edge each with first and second tabs.
Figure 10:
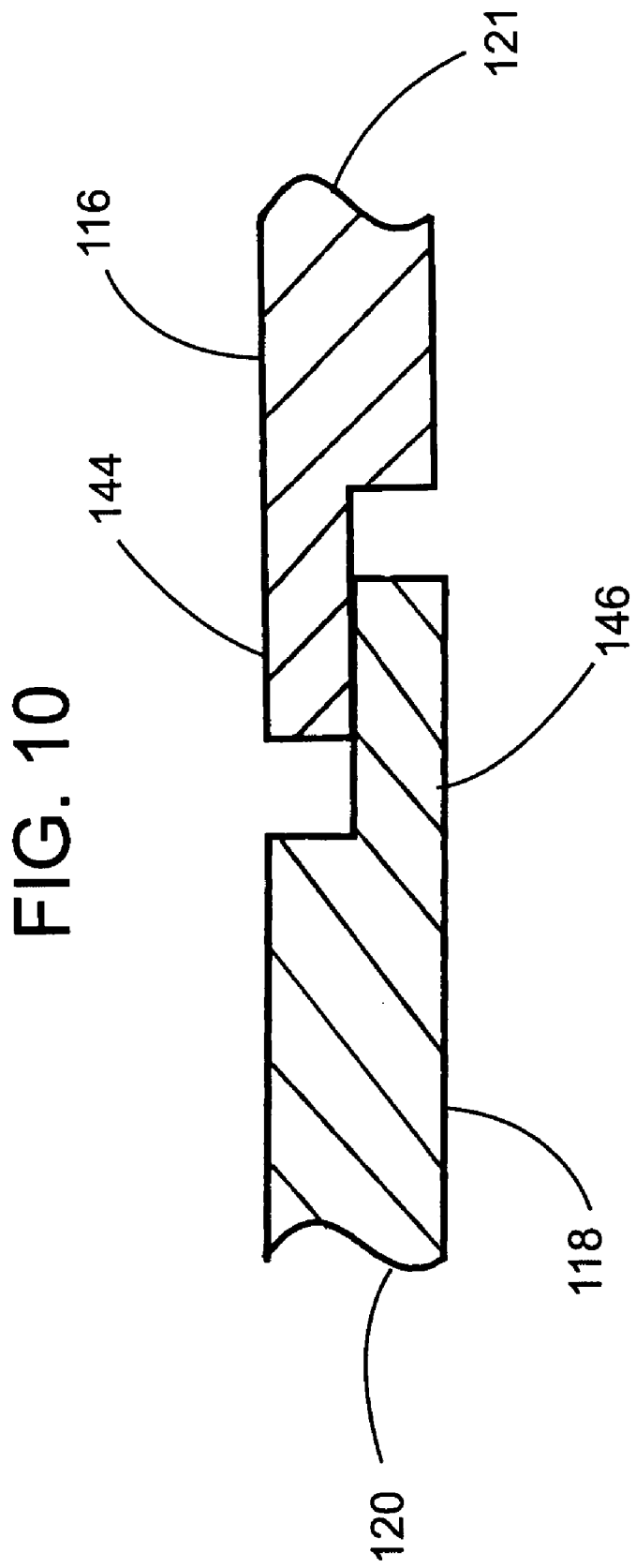
FIG. 10 is a detailed cross-sectional view illustrating the engagement of the first tab sliding over the second tab.

Referring to FIGS. 9 and 10, to enable the adjacent panels 120, 121 to interlock with each other, each interlocking edge 140, 141 can include a plurality of interlocking tabs 144, 146 formed along the length of the edge. More specifically, the tabs can be of a first type 144 or of a second type 146 that alternate along the interlocking edge 140, 141. The first tabs 144 are generally co-planer with the first surface 116 and have a thickness that extends partially toward the second surface 118. Similarly, the second tabs 146 are generally co-planer with the second surface 118 and have a thickness that extends partially toward the first surface 116. Preferably, the thickness of both the first and second tabs 144, 146 extends approximately half way to the opposing surface.

As illustrated in FIG. 9, each first tab 144 along the length of a first interlocking edge 140 corresponds to a second tab 146 along the length of an opposing second interlocking edge 141. To engage the first and second interlocking edges 144, 146, the panels 120, 121 are moved together in the direction indicated by the arrows 148 till the interlocking edges 140, 141 abut. As illustrated in FIG. 10, this causes the first tabs 144 to slide over the second tabs 146 such that the first and second tabs are in contact. In the embodiments where the thickness of the tabs 144, 146 is approximately half the distance between the first and second surfaces 116, 118, the surfaces of the adjacent panels 120, 121 are co-planer. Referring to FIGS. 2 and 3, it will be appreciated that because of the alternating arrangement of the first and second tabs 144, 146, an interlocking mesh is formed that prevents bending between adjacent panels with respect to both the first and second surfaces 116, 118 of the interposer assembly.

Figure 11:
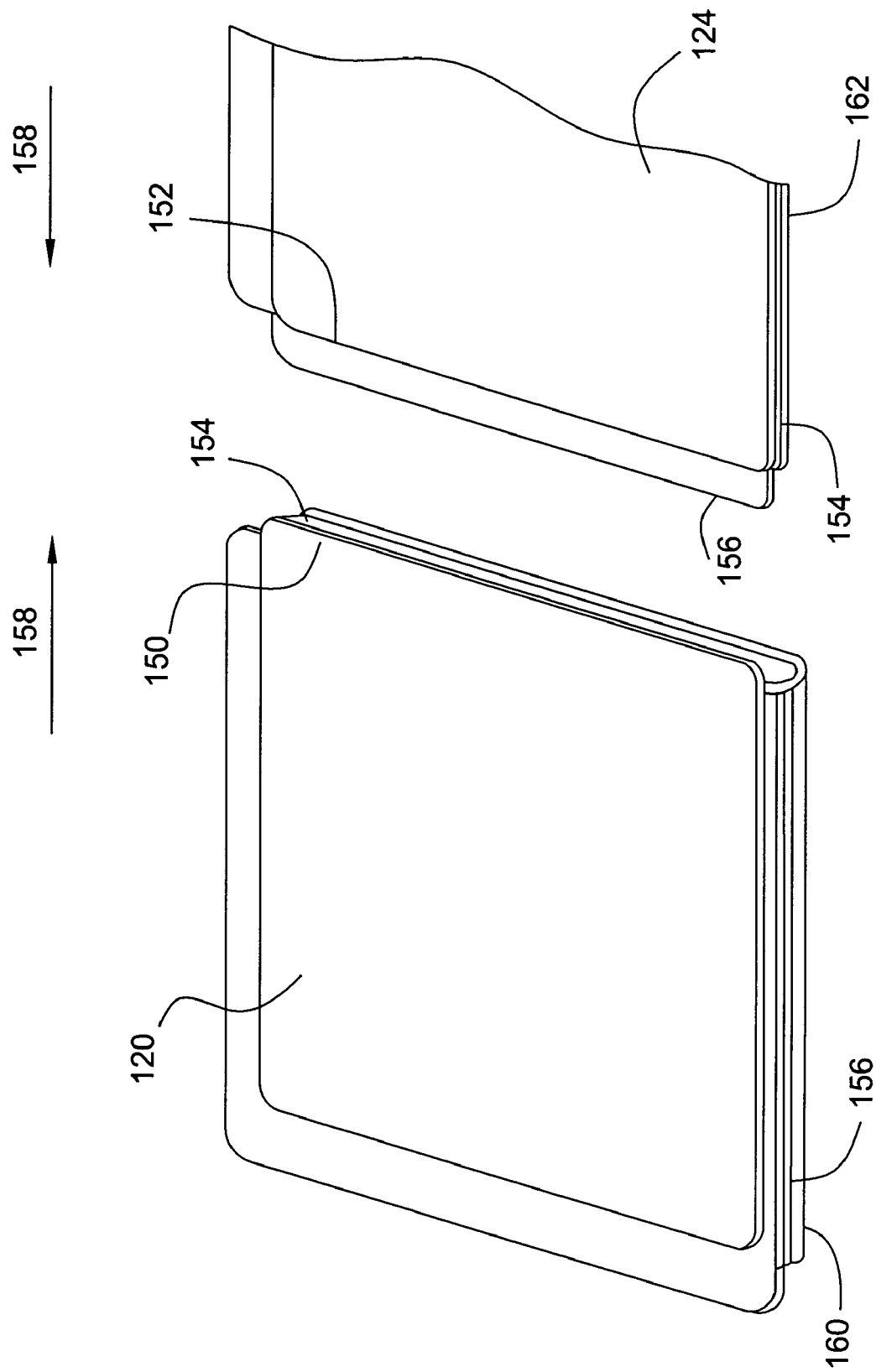
FIG. 11 is a perspective view of two panels illustrating an interlocking edge having a groove and an opposing interlocking edge having a tongue.

Illustrated in FIG. 11 is another embodiment of the interlocking edges 150, 152 for enabling adjacent panels 120, 121 to engage each other. The first interlocking edge 150 extending along the length of a first panel 120 is configured to define a groove 154 while the second interlocking edge 152 extending along the length of an opposing second panel 121 is formed as a tongue 156. To engage the first and second interlocking edges 150, 152, the panels 120, 121 are moved together in the direction indicated by the arrows 158 till the tongue 156 is inserted into the groove 154. As illustrated, to enable four panels to be arranged in a 2×2 configuration, the third interlocking edge 160 perpendicular the first interlocking edge 150 is formed as a tongue 156 while the fourth interlocking edge 162 perpendicular to the second interlocking edge 152 on the adjacent panel 121 is formed as a groove 154.

Figure 12:
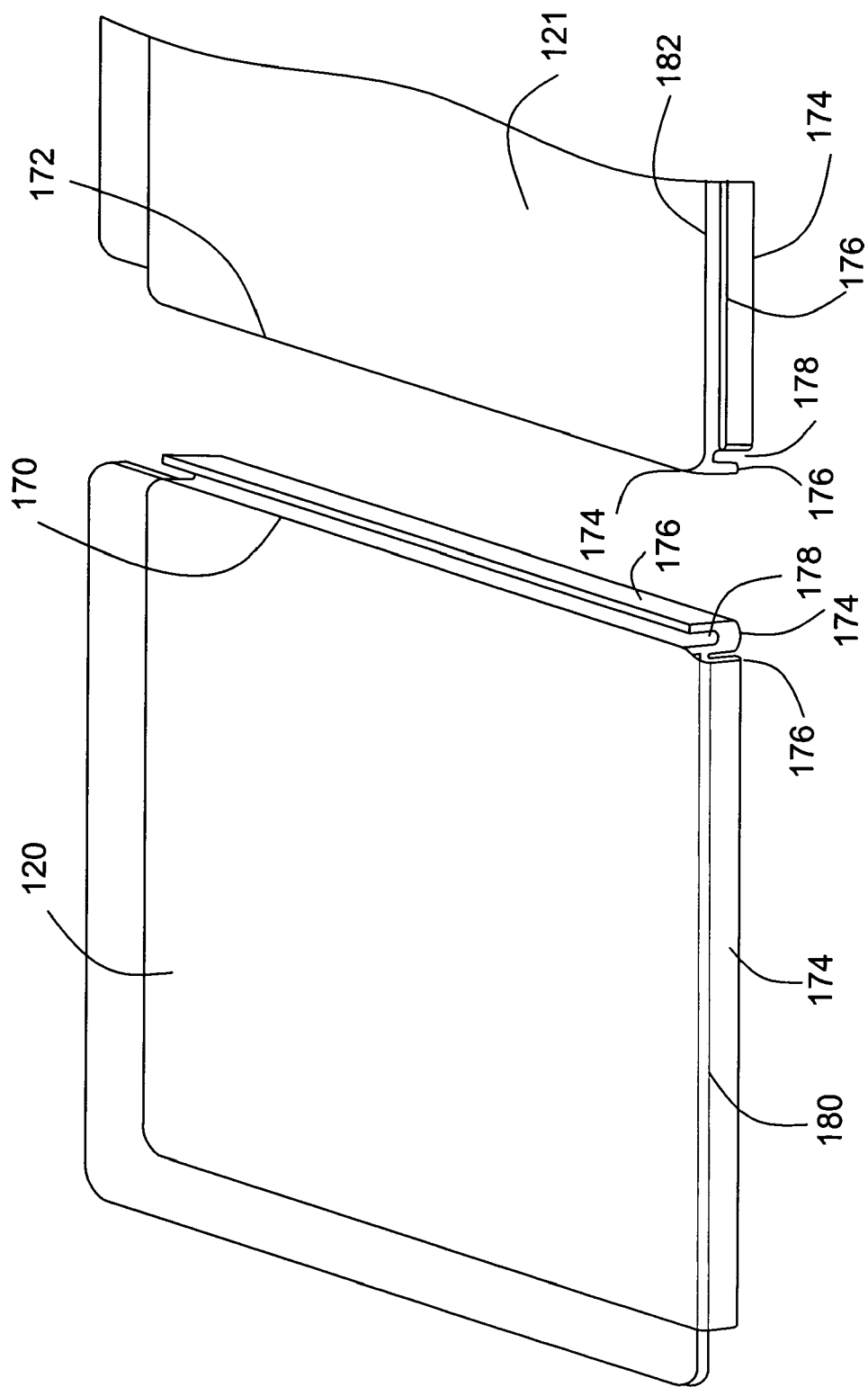
FIG. 12 is a perspective view of two panels illustrating an interlocking edge and an opposing interlocking edge each formed as a claw defining a groove.

Illustrated in FIG. 12 is another embodiment of the interlocking edges 170, 172 for enabling adjacent panels 120, 121 to engage each other. The first interlocking edge 170 extending along the length of the panel 120 is formed as a claw 174 having an upward oriented L-shaped leg 176 that defines a groove 178. The second interlocking edge 172 extending along the length of the adjacent panel 121 is similarly formed as a claw 174 having an opposed upwards oriented L-shaped leg 176 that likewise defines a groove 178. To engage the first and second interlocking edges 170, 172, the panels 120, 121 are moved together so that the legs 176 of each interlocking edge 170, 172 are received in the grooves 178 of the opposed interlocking edge. As illustrated, to enable four panels to be arranged in a 2×2 configuration, the third interlocking edge 180 perpendicular the first interlocking edge 170 is formed as a claw 174 having a downward oriented L-shaped leg 176 while the fourth interlocking edge 182 extending along the adjacent panel 120 is formed as a claw 174 having an upward oriented L-shaped leg 176.

Referring to FIG. 8, to accommodate the panels 120 in a supporting manner, the frame 200 includes four sides 202 arranged to define a window 204. As illustrated in FIGS. 2 and 3, when assembled, the panels 120 are held within the frame 200 such that frame edges 142 engage the sides 202 and the apertures 122 are located within the window. Because the four adjacent panels only engage the frame 200 along their outer frame edges 142, the apertures 122 can be arranged across the panels 120 to locations near the interlocking edges 140, 141. This allows for a greater number of electrical contacts to be accommodated in each panel and, accordingly, within the interposer assembly overall. In the illustrated embodiment, each panel can include 1849 apertures thus producing an interposer assembly that can accommodate a total of 7396 contacts.

Though the present embodiment of the interposer assembly is illustrated as having a square frame holding square panels, the precise shape of the frame and panels is unimportant. Accordingly, in other embodiments, the frame and panels can include any number of sides and edges. Likewise, the frame can be circular in shape and the panels can be formed as quarter-circles.

Figure 13:
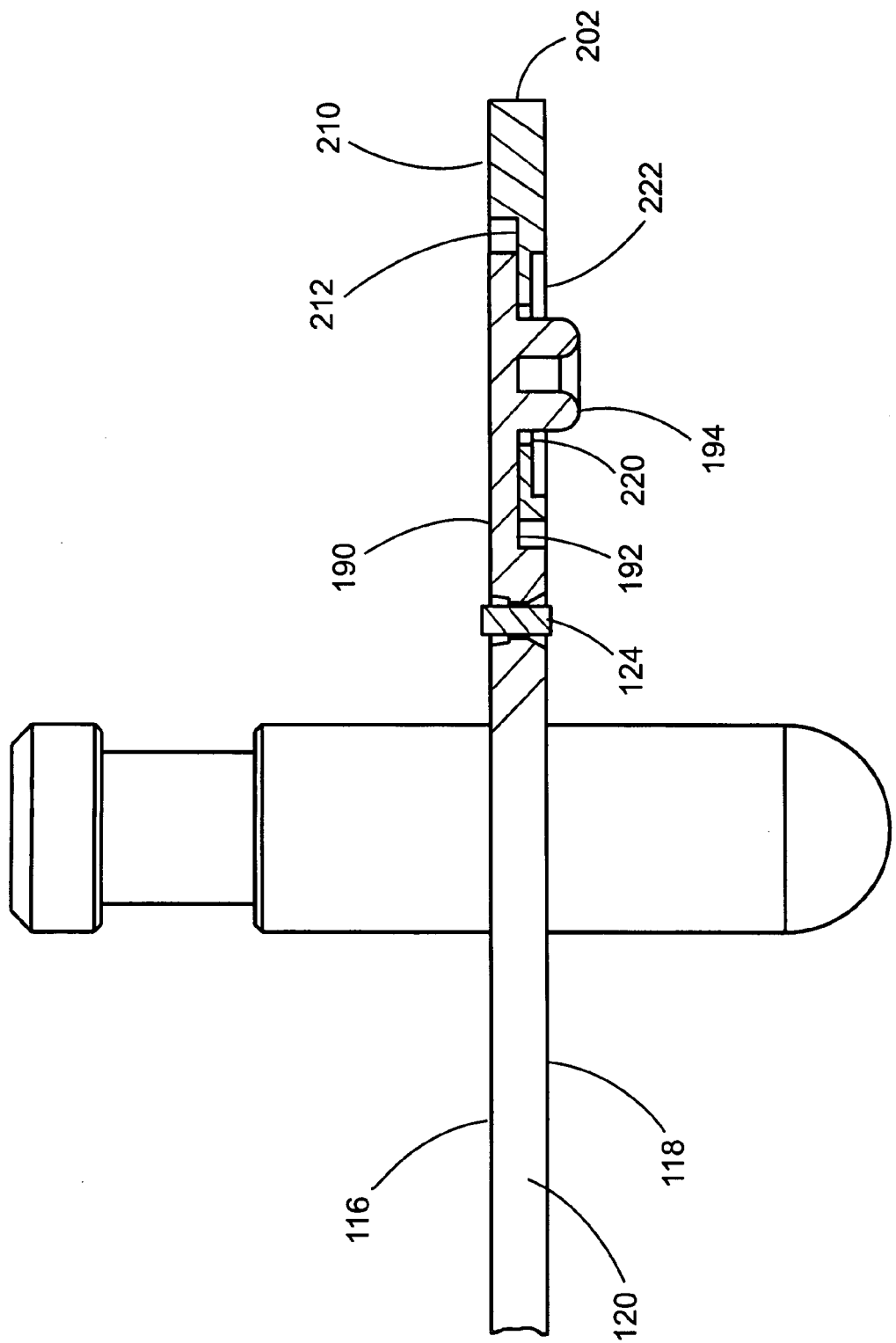
FIG. 13 is a detailed view taken of the indicated area of FIG. 4 illustrating the engagement of the flange with the step and the protrusion projecting through the hole prior to heat staking.

To engage the sides, each of the frame edges 142 may include an outward projecting flange 190 generally extending along the length of the frame edge. As illustrated in FIG. 13, the flange 190 is generally co-planer with the first surface 116 and extends partially toward the second surface 118 so that the flange is not as thick as the remainder of the panel. The flange 190 thus defines a flange face 192 that is parallel to and offset from the second surface 118.

For engaging the flange, the illustrated side 202 can include a step formed into the first surface 116 that drops toward the second surface 118. The step thereby defines a raised face 210 and a step face 212 wherein the step face is parallel to and offset from the raised face. When assembled together, the flange face 192 is placed adjacent to and extends partially across the step face 212. Preferably, the thickness of the flange 190 and the depth to the step face 212 are dimensioned so that the surfaces of the panels 120 and the frame 200 are co-planer and the contacts 124 protrude beyond the first and second surfaces 116, 118 of the interposer assembly.

In an embodiment, the frame can be made of molded fiberglass reinforced plastic. In another embodiment, to provide greater strength and stability, the frame can be machined from metal. Because the interlocking edges of the panels cooperate to align the apertures, the engagement between the frame and the panels can incorporate enough play to tolerate inexactitude in the structure of the frame. Therefore, secondary machining of the molded frame may be unnecessary.

Figure 14:
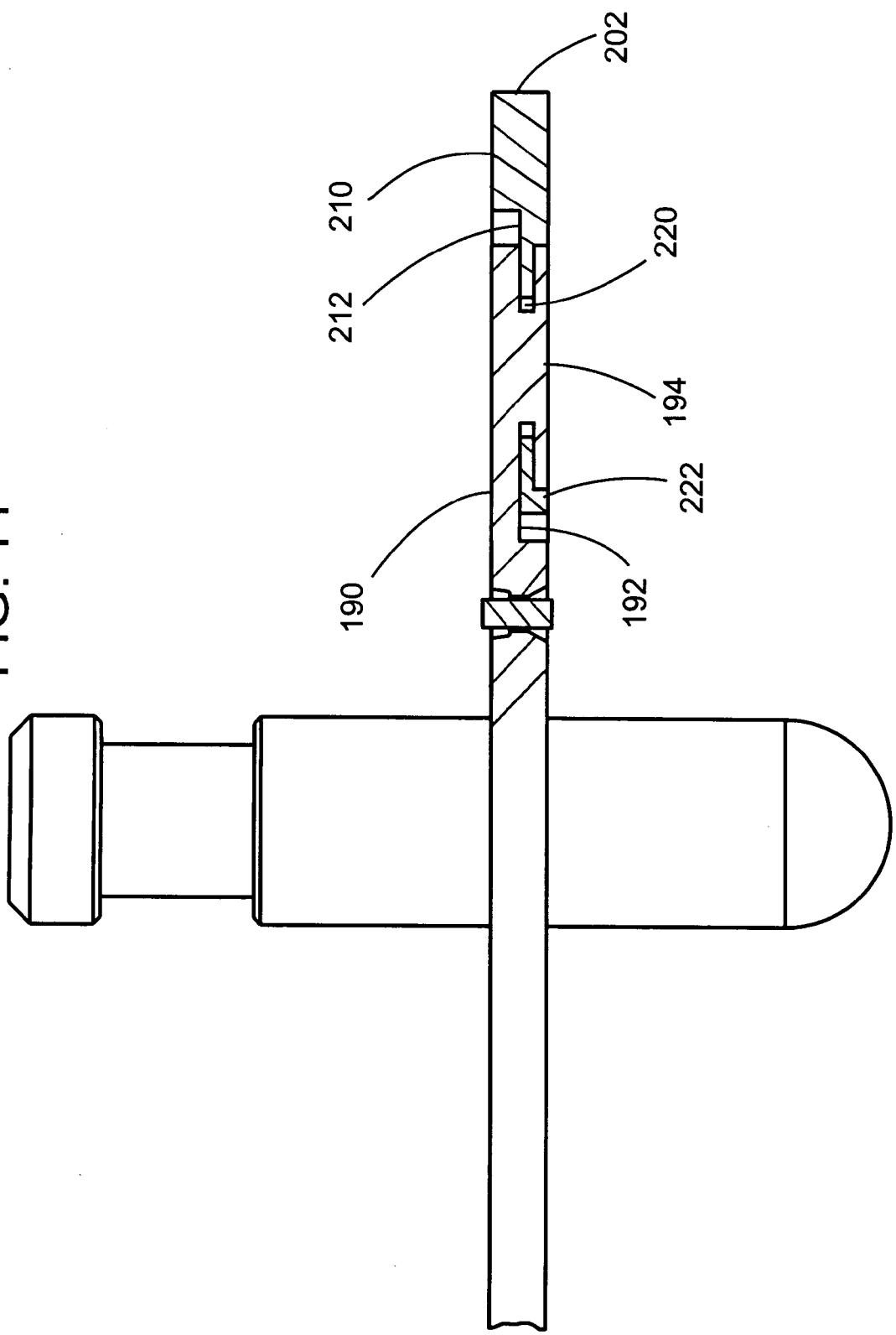
FIG. 14 is similar to FIG. 13 illustrating the protrusion projecting through the hole after heat staking.

To permanently join the panels to the frame and prevent the interposer assembly from being unintentionally disassembled, the flanges can be heat staked to the sides. More specifically, as illustrated in FIG. 8, each of the flanges 190 can include a protrusion 194 or plurality of protrusions that extends from the flange face and are spaced along the frame edge 142. The protrusions 194 correspond to holes 220 disposed through the sides 202 of the frame 200. When the panel and frame are assembled together, as illustrated in FIG. 13, the protrusions 194 project through the holes 220 and extend beyond the second surface 118. As illustrated in FIG. 14, the protrusions 194 can thereafter be melted down or otherwise deformed so that protrusion material flows around a counter-bore 222 associated with the hole 220. The frame and the panel are thereby effectively riveted together. Preferably, to ensure that the electrical contact 124 connects with the LGA's none of the protrusion material should remain projecting beyond the second surface 118. In other embodiments, instead of heat staking, adhesive can be used to permanently join the panels to the frame.

Referring to FIG. 8, to simplify assembly and reduce the cost of the interposer assembly, each of the panels 120 can be identically formed and arranged symmetrically. More specifically, each panel 120 can have the first interlocking edge 140 and the opposing second interlocking edge 141 located perpendicularly to each other. Additionally, each frame edge 142 can be identical with the protrusions 194 placed in the same location. As a result, referring to FIGS. 2 and 3, each panel 120 can be interchangeable with any other panel in the 2×2 configuration of the interposer assembly 100.

Referring to FIG. 8, to assemble the illustrated interposer assembly 100, four panels 120 are first arranged so that each interlocking edge 140 is facing an opposing interlocking edge 141 of another panel. The panels 120 are next moved adjacent to each other so that the first and second tabs engage as described above. The interlocking panels 120 are next set within the frame 200 so that the flanges are received within the step as also described above. Next, the protrusions 194 can be heat staked to the holes 220 in the frame sides 202. Contacts can be inserted into the apertures 122 of the panels 120 prior to, during, or after assembly.

Referring to FIG. 1, to align the interposer assembly 100 with the contact pads or traces 110 on the printed circuit board 104 and the LGA of contact pads 108 on the integrated circuit package 102, the interposer assembly, in an embodiment, can include one or more alignment pins 230. As illustrated in FIGS. 2 and 3, the alignment pins 230 are located on tabs 232 that extend outwards from the frame 200. The alignment pins can be received in corresponding pin holes located on the circuit board and in a manner commonly known by those of skill in the art. In different embodiments, the tabs 232 can include openings instead of alignment pins. Those openings can correspond to and relieve alignment pins included on the printed circuit board or the integrated circuit.

Figure 15:
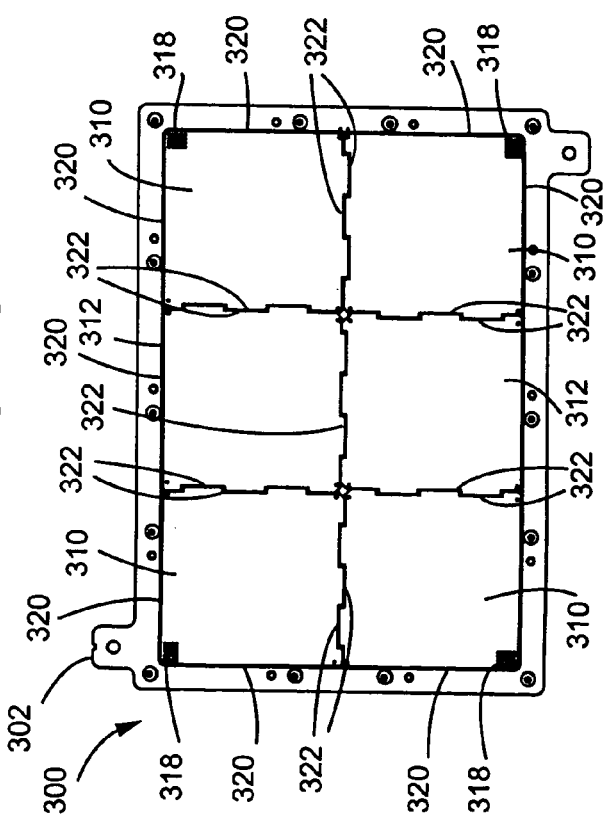
FIG. 15 is a top plan view of another embodiment of an interposer assembly incorporating six panels held together in a frame in a 2×3 configuration.

To increase the number of contacts included with the interposer assembly while still providing for desirably sized panels, the number of panels can be increased. As illustrated in FIG. 15, in another embodiment, interposer assembly 300 can provide for a 2×3 configuration of panels 310, 312 held together by and supported within a generally rectangular frame 302. Each of the panels 310, 312 is planer, includes a plurality of apertures 318, and is generally square in shape. To interlock together properly though, the corner panels 310 and the intermediate panels 312 may be formed differently. The corner panels 310 each include two perpendicular frame edges 320 and two corresponding interlocking edges 322. The intermediate panels, however, each include one frame edge 320 and three interlocking edges 322 so that the intermediate panels can engage with three directly adjacent panels. The interlocking edges 322 can be formed and function in the above-described manner.

Figure 16:
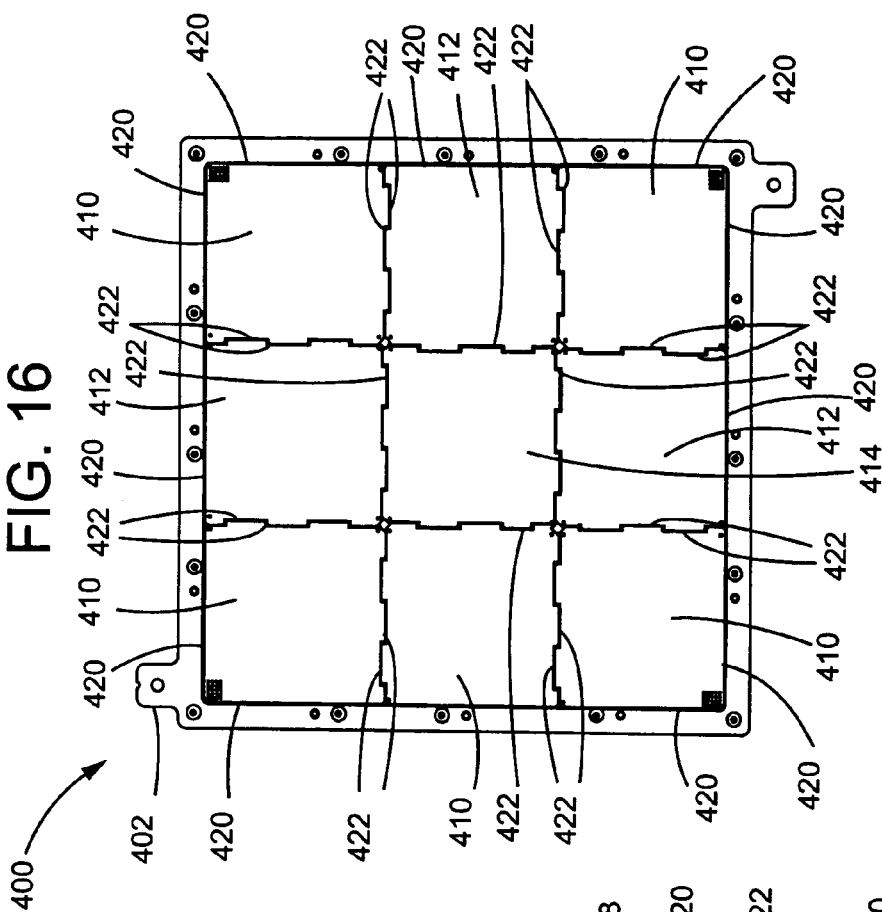
FIG. 16 is a top plan view of another embodiment of an interposer assembly incorporating nine panels held together in a frame in a 3×3 configuration.

Referring to FIG. 16, another embodiment of an interposer assembly 400 is illustrated in which a total of nine panels are placed in a 3×3 configuration. The panels are held together and supported by a generally square frame 402. To interlock together properly, three different panels are necessary. The corner panels 410 each include two perpendicular frame edges 420 and two corresponding interlocking edges 422. The intermediate panels 412 include one frame edge 420 and three interlocking edges 422. A center panel 414, located in the center of the 3×3 configuration, includes four interlocking edges so that the center panel can engage with four directly adjacent panels. The interlocking edges 422 can be formed and function in the above-described manners.

Figure 17:
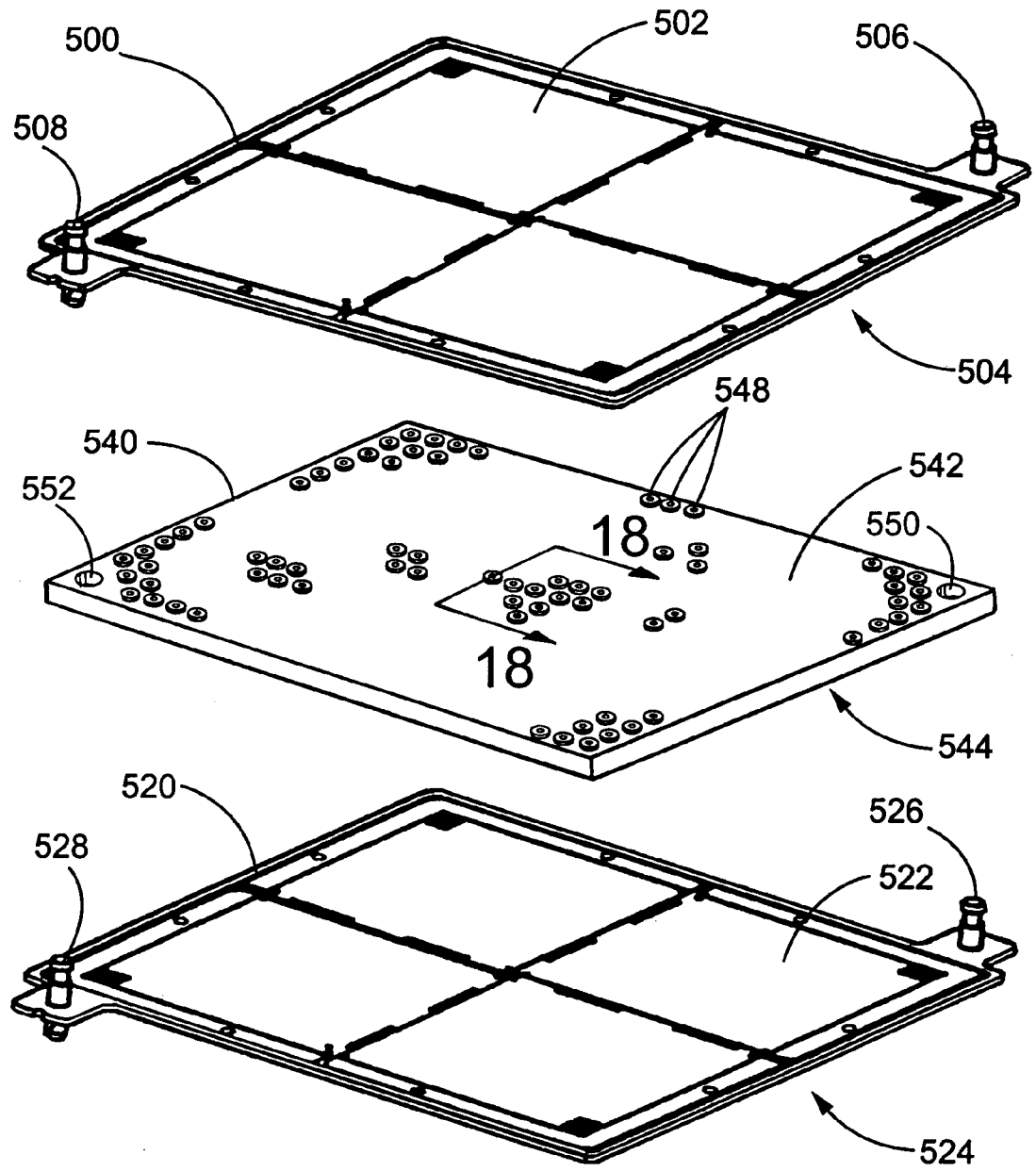
FIG. 17 is an exploded, perspective view of a first and second interposer assembly in an illustrative setting placed on opposite sides of a spacer.
Figure 18:
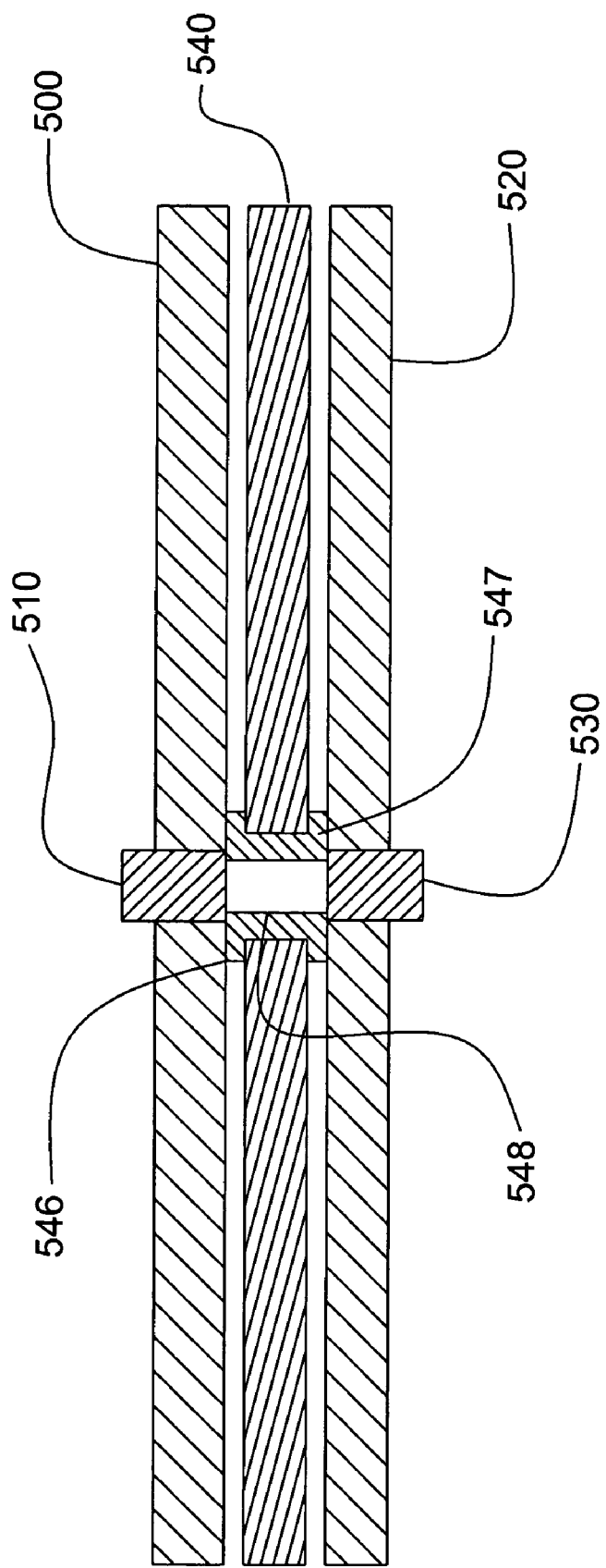
FIG. 18 is a cross-sectional view taken along lines 18—18 of FIG. 17 illustrating in detail the interposer assemblies, contacts, and spacer.

Though thus far the interposer assembly has been described as a single unit used to electrically connect an integrated circuit package to a printed circuit board, the interposer assembly is contemplated as serving in other applications. For example, illustrated in FIGS. 17 and 18 are a first and second interposer assemblies 500, 520 used to establish an electrical connection between, for example, two opposed circuit boards. To provide adequate space between the printed circuit boards so that components mounted thereon do not interfere, a spacer 540 is placed between the first and second interposer assemblies 500, 520.

The interposer assemblies 500, 520 are generally planer structures of the type described above having a first surface 502, 522 and an opposed second surface 504, 524. The spacer 540 is also a generally planer structure having a first surface 542 and an opposed second surface 544 that define the thickness needed to separate the interposer assemblies 500, 520. The spacer can be made from, for example, insulative glass-fiber reinforced plastic. To establish a conductive path through the spacer, a plurality of holes 548 are disposed from the first surface 542 to the second surface 544. Additionally, a plurality of raised pads 546 is formed on each surface corresponding to the holes 548. The pads 546 can be formed by plating the hole 548 and the relevant vicinity of the first and second surfaces 542, 544 with an conductive material 547 by any of a number of plating operations as are well known by those of skill in the art. Accordingly, as will be appreciated from FIG. 18, a conductive path is established by the conductive material 547 between the first and second surfaces 542.

In use, the second surface 504 of the first interposer assembly 500 is placed adjacent to the first surface 542 of the spacer 540 and the first surface 522 of the second interposer assembly 520 is placed adjacent to the second surface 544 of the spacer. As illustrated in FIG. 18, this arrangement allows the raised pads 546 to contact the contacts 510, 530 retained in the interposer assemblies thus establishing an electrical path from the first surface 502 of the first interposer assembly 500 to the second surface 524 of the second interposer assembly 520. To assist in aligning the pads with the contacts, as illustrated in FIG. 17, the spacer 540 can include a pair of pin holes 550, 552 that can receive the alignment pins 506, 508 of the first interposer assemble 500 and the alignment pins 526, 528 of the second interposer assemble 530.

Figure 19:
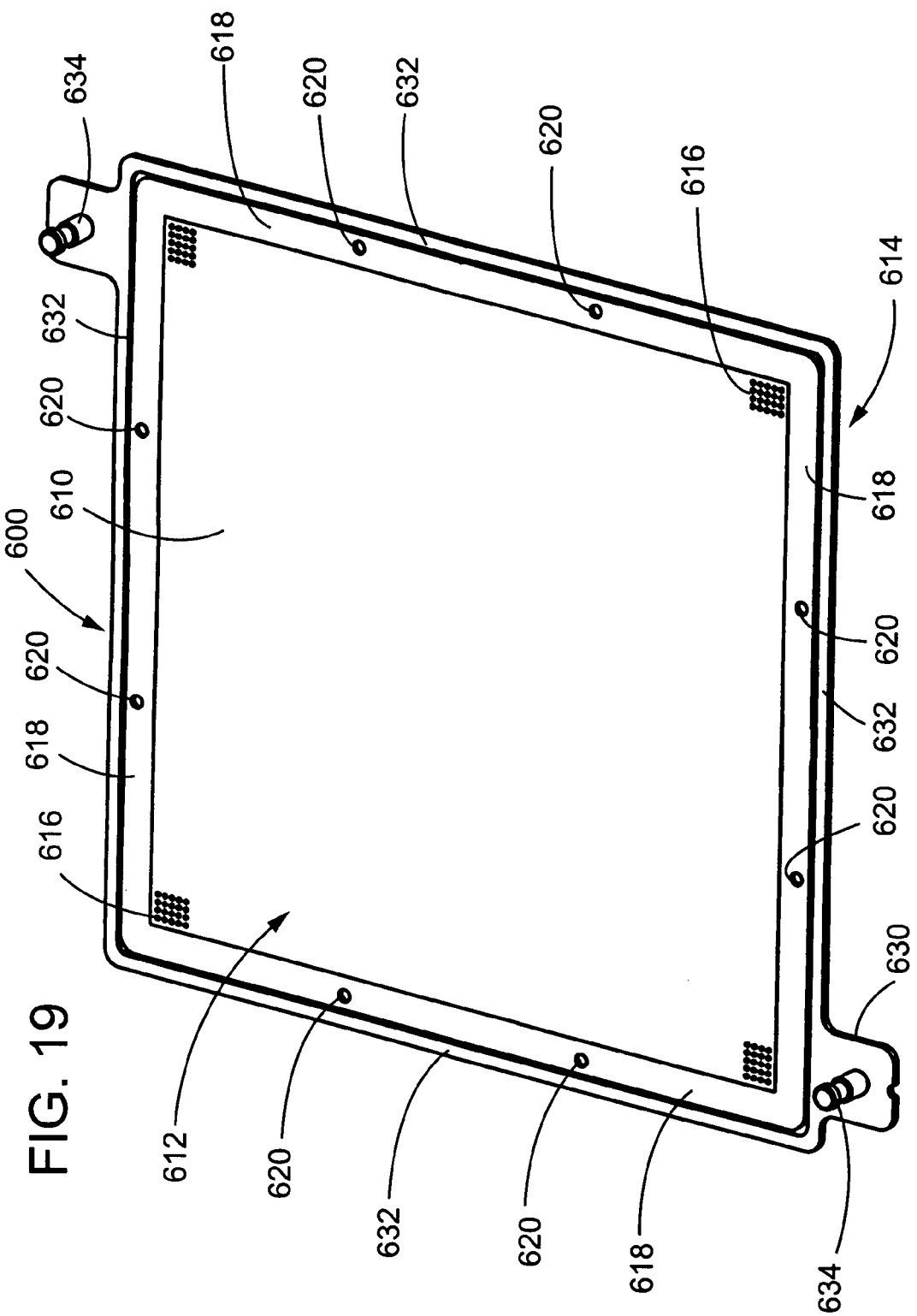
FIG. 19 is a perspective view of a embodiment of the interposer assembly having a single panel engaging a frame.

Illustrated in FIG. 19 is another embodiment of the interposer assembly 600 having a single panel 610 engaging a frame 630. The panel 610 is a thin, planer structure having a first and opposing second surfaces 612, 614, and plurality of apertures 616 disposed therebetween. The panel 610 also includes a plurality of frame edges 618 that engage the sides 632 of the frame 630 in the above-described manner. Although in the illustrated embodiment the panel 610 and frame 630 are square, it will be readily appreciated that the panel and frame can be provided in various different shapes.

To reduce the volume of LCP used to mold the panel 610 and thereby reduce the problems associated with shrinkage, the panel is molded reasonably thin. For instance, the thickness of the panel can be on the order of 0.032 inches. At such a dimension though, the panel 610 is rather unstable and can be easily deformed within an application. Therefore, the sides 632 of the frame 630 are made substantially more robust to provide support for the panel 610. To secure the panel 610 within the frame, the panel may include a plurality of protrusions 620 that can be received in and heat staked to holes formed in the sides 632 in the above-described manner. To align the apertures 616 with the contact pads or traces of the application, the frame 630 can include one or more alignment pins 634.

Thus, the present invention provides an interposer assembly that includes a frame and a panel or plurality of panels, in which each panel can accommodate a plurality of contacts. By utilizing a thin single panel or multiple panels to assemble the interposer assembly, the dimensions of each panel are reduced such that problems with shrinkage during the forming of the panels is mitigated. Moreover, because the panels engage each other with interlocking edges, the arrangement of the apertures that contain the contacts can extend across the panel to locations near the interlocking edges thereby increasing the number of contacts accommodated in each panel. Furthermore, the engagement between the frame and the panels incorporates enough play to tolerate inexactitude of the frame and thereby eliminates the need for secondary machining of the frame.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments would become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. An interposer assembly for connecting an integrated circuit package to a circuit-carrying element, the interposer assembly comprising:
    a frame defining a window;
    a plurality of panels, each panel including a first surface, an opposed second surface, a frame edge, a tongue edge, a groove edge, and an aperture disposed from the first surface through to the second surface, the plurality of panels held in the window;
    a contact located in the aperture;
    wherein the frame edge of each panel engages the frame, and the tongue edge of each panel is inserted into the groove edge of another panel.

2. The interposer assembly of claim 1, wherein the frame is made from glass fiber reinforced plastic.

3. The interposer assembly of claim 1, wherein the frame is machined from metal.

4. The interposer assembly of claim 1, wherein each panel is made from molded liquid crystal polymer.

5. The interposer assembly of claim 1, comprising four panels.

6. The interposer assembly of claim 5, wherein each panel includes two frame edges.

7. The interposer assembly of claim 6, wherein the two frame edges are normal to each other, the tongue edge and the groove edge are normal to each other, and each panel is generally square in shape.

8. The interposer assembly of claim 7, wherein each panel has a maximum dimension of 2 inches by 2 inches.

9. The interposer assembly of claim 8, wherein each panel is symmetrical and interchangeable.

10. The interposer assembly of claim 9, wherein the frame includes four sides defining a square window.

11. The interposer assembly of claim 1, wherein the frame includes a step face and a raised face.

12. The interposer assembly of claim 11, wherein the frame edge includes a flange co-planer with the first surface and extending partially towards the second surface to define a flange face.

13. The interposer assembly of claim 12, wherein the flange face is adjacent the step face when the frame edge engages the frame.

14. The interposer assembly of claim 13, wherein the raised face is generally co-planer with the first surface when the frame edge engages the frame.

15. The interposer assembly of claim 1, wherein the contact is resilient.

16. The interposer assembly of claim 15, wherein the contact is a wadded wire contact.

17. The interposer assembly of claim 15, wherein the contact is an elastomeric contact.

18. The interposer assembly of claim 15, wherein the contact is a spring contact.

19. The interposer assembly of claim 1, wherein three contacts are located in each aperture.

20. The interposer assembly of claim 19, wherein the three contacts include a slug contact placed between two button contacts.

21. The interposer assembly at claim 19, wherein the three contacts include a wadded wire contact placed between two plunger contacts.

22. The interposer assembly of claim 1, wherein each panel includes 1849 apertures.

23. The interposer assembly of claim 22, wherein the volume of liquid crystal polymer used to mold each panel is 0.106 inches cubed.

24. An interposer assembly for connecting an integrated circuit package to a circuit-carrying element, the interposer assembly comprising:
   a frame defining a window;
   a plurality of panels, each panel including a first surface, an opposed second surface, a frame edge, a claw edge having an L-shaped leg defining a groove, and an aperture disposed from the first surface through to the second surface, the plurality of panels held in the window;
   a contact located in the aperture;
   wherein the frame edge of each panel engages the frame, and the claw edge of each panel engages a claw edge of another panel.

25. The interposer assembly of claim 24, wherein the frame is made from glass fiber reinforced plastic.

26. The interposer assembly of claim 24, wherein the frame is machined from metal.

27. The interposer assembly of claim 24, wherein each panel includes 1849 apertures.

28. The interposer assembly of claim 24, wherein a portion of the L-shaped leg of a first claw edge is inserted into a groove of an opposing second claw edge to engage the claw edges.

29. The interposer assembly of claim 2, comprising four panels.

30. The interposer assembly of claim 29, wherein each panel includes two frame edges and two claw edges, each panel being generally square in shape.

31. The interposer assembly of claim 30, wherein the two frame edges are normal to each other, the two claw edges are normal to each other, and each panel is generally square in shape.

32. The interposer assembly of claim 31, wherein each panel has a maximum dimension of 2 inches by 2 inches.

33. The interposer assembly of claim 32, wherein each panel is symmetrical and interchangeable.

34. The interposer assembly of claim 33, wherein the frame includes four sides defining a square window.

35. The interposer assembly of claim 24, wherein the frame includes a step face and a raised face.

36. The interposer assembly of claim 35, wherein the frame edge includes a flange co-planer with the first surface and extending partially towards the second surface to define a flange face.

37. The interposer assembly of claim 36, wherein the flange face is adjacent the step face when the frame edge engages the frame.

38. The interposer assembly of claim 37, wherein the raised face is generally co-planer with the first surface when the frame edge engages the frame.

39. The interposer assembly of claim 24, wherein the contact is resilient.

40. The interposer assembly of claim 39, wherein the contact is a wadded wire contact.

41. The interposer assembly of claim 39, wherein the contact is an elastomeric contact.

42. The interposer assembly of claim 39, wherein the contact is a spring contact.

43. The interposer assembly of claim 24, wherein three contacts are located in each aperture.

44. The interposer assembly of claim 43, wherein the three contacts include a slug contact placed between two wadded wire contacts.

45. The interposer assembly of claim 43, wherein the three contacts include a wadded wire contact placed between two plunger contacts.

46. The interposer assembly of claim 24, wherein each panel is made from molded liquid crystal polymer.

47. The interposer assembly of claim 46, wherein the volume of liquid crystal polymer used to mold each panel is 0.106 inches cubed.

48. An interposer assembly for connecting an integrated circuit package to a circuit-carrying element, the interposer assembly comprising:
   a frame defining a window, the frame including a hole;
   a plurality of panels, each panel including a first surface, an opposed second surface, an interlocking edge, and a frame edge having a flange co-planer with the first surface and extending partially towards the second surface to define a flange face, the flange including a protrusion projecting from the flange face;
   wherein the frame edge of each panel engages the frame such that the protrusion projects through the hole, and the interlocking edge of each panel engages the interlocking edge of another panel.

49. The interposer assembly of claim 48, wherein the protrusion is heat staked in the hole.

50. The interposer assembly of claim 48, wherein the frame is made from molded glass fiber reinforced plastic.

51. The interposer assembly of claim 48, wherein the frame is made of metal.

52. The interposer assembly of claim 48, wherein the protrusion is made of molded liquid crystal polymer.

53. The interposer assembly of claim 48, wherein each panel includes an aperture disposed from the first surface through to the second surface, and a contact located in the aperture.

54. The interposer assembly of claim 48, wherein the frame includes a step face and a raised face, the step face adjacent to the flange face when the frame edge engages the panel.

55. The interposer assembly of claim 54, wherein the raised face is generally co-planer with the first surface when the frame edge engages the frame.

56. The interposer assembly of claim 55, wherein the hole is disposed through the step face.

57. The interposer assembly of claim 56, wherein the frame includes four sides defining a square window, each side including a hole.

58. An interposer assembly for connecting an integrated circuit package to a circuit-carrying element, the interposer assembly comprising
   a frame defining a window, the frame made from molded plastic;
   a plurality of panels, each panel including a first surface, an opposed second surface, a frame edge, an interlocking edge, and an aperture disposed from the first surface through to the second surface, the plurality of panels held in the window;
   a contact located in the aperture;
   wherein the frame edge of each panel engages the frame, and the interlocking edge of each panel engages the interlocking edge of another panel.

59. The interposer assembly of claim 58, wherein the plastic frame is glass fiber reinforced.

60. The interposer assembly of claim 59, wherein the frame includes a step face and a raised face, and a hole disposed through the step face.

61. The interposer assembly of claim 60, wherein the frame edge includes a flange co-planer with the first surface and extending partially towards the second surface to define a flange face, and a protrusion projecting from the flange face.

62. The interposer assembly of claim 61, wherein the protrusion projects through the hole when the frame edge engages the frame.

63. A method of assembling an interposer assembly comprising:
   providing a plurality of panels, each panel including a first surface, an opposed second surface, an interlocking edge, and a frame edge having a projecting protrusion;
   providing a frame defining a window, the frame including a hole;
   engaging the interlocking edges of the panels together; and
   inserting the protrusion through the hole to engage the frame edge with the frame.

64. The method of claim 63, further comprising heat staking the protrusion in the hole.

65. The method of claim 63, further comprising inserting a contact into an aperture disposed from the first surface through to the second surface.

66. The method of claim 63, wherein providing the frame includes molding the frame from plastic.

67. The method of claim 63, wherein providing the frame includes machining the frame from metal.

* * * * *

UNITED STATES PATENT AND TRADEMARK OFFICE
CERTIFICATE OF CORRECTION

PATENT NO. : 6,881,073 B2  
APPLICATION NO. : 10/639351  
DATED : April 19, 2005  
INVENTOR(S) : Bali et al.

Page 1 of 1

It is certified that error appears in the above-identified patent and that said Letters Patent is hereby corrected as shown below:

IN THE CLAIMS:  
Column 11, Line 66: "claim 2," should read --claim 28--.

Signed and Sealed this

Twenty-ninth Day of April, 2008

JON W. DUDAS  
*Director of the United States Patent and Trademark Office*